United States Patent [19]

Taylor

[11] Patent Number: 5,053,639
[45] Date of Patent: Oct. 1, 1991

[54] SYMMETRICAL CLOCK GENERATOR AND METHOD

[75] Inventor: Billy K. Taylor, Columbia, S.C.

[73] Assignee: NCR Corporation, Dayton, Ohio

[21] Appl. No.: 367,293

[22] Filed: Jun. 16, 1989

[51] Int. Cl.$^5$ .................. H03K 5/13; H03K 5/153; H03L 7/00; G01R 25/00
[52] U.S. Cl. .................................. 307/269; 307/516; 307/350; 307/359; 328/53; 328/63
[58] Field of Search ............... 307/269, 494, 498, 362, 307/363, 359, 290, 268, 516; 328/63, 72, 146, 149, 150, 156, 53

[56] References Cited

U.S. PATENT DOCUMENTS

| | | | |
|---|---|---|---|
| 3,740,660 | 6/1973 | Davies, Jr. | 331/45 |
| 3,829,790 | 8/1974 | Macrander | 331/61 |
| 3,961,269 | 6/1976 | Alvarez, Jr. | 328/62 |
| 4,034,303 | 7/1977 | Kodaira | 328/62 |
| 4,191,998 | 3/1980 | Carmody | 328/62 |
| 4,306,190 | 12/1981 | Beckwith et al. | 328/62 |
| 4,362,957 | 12/1982 | Stern | 307/527 |
| 4,463,440 | 7/1984 | Nishiura et al. | 328/62 |
| 4,554,465 | 11/1985 | Koike | 328/62 |
| 4,638,256 | 1/1987 | Hong et al. | 328/62 |
| 4,654,599 | 3/1987 | Zbinden et al. | 328/62 |
| 4,710,647 | 12/1987 | Young | 307/269 |
| 4,761,568 | 8/1988 | Stronski | 307/269 |
| 4,794,275 | 12/1988 | Traa | 307/269 |
| 4,959,557 | 9/1990 | Miller | 307/269 |

*Primary Examiner*—John S. Heyman
*Assistant Examiner*—Trong Phan
*Attorney, Agent, or Firm*—Wilbert Hawk, Jr.; Stephen F. Jewett; Douglas S. Foote

[57] ABSTRACT

A device and method for generating a symmetrical clock signal. The device comprises a signal generator, buffer and differential amplifier. The signal generator generates a periodic wave signal. The buffer receives the periodic wave signal and provides a square wave clock signal. The differential amplifier receives the clock signal and a reference voltage signal and provides an error signal to the buffer.

26 Claims, 1 Drawing Sheet

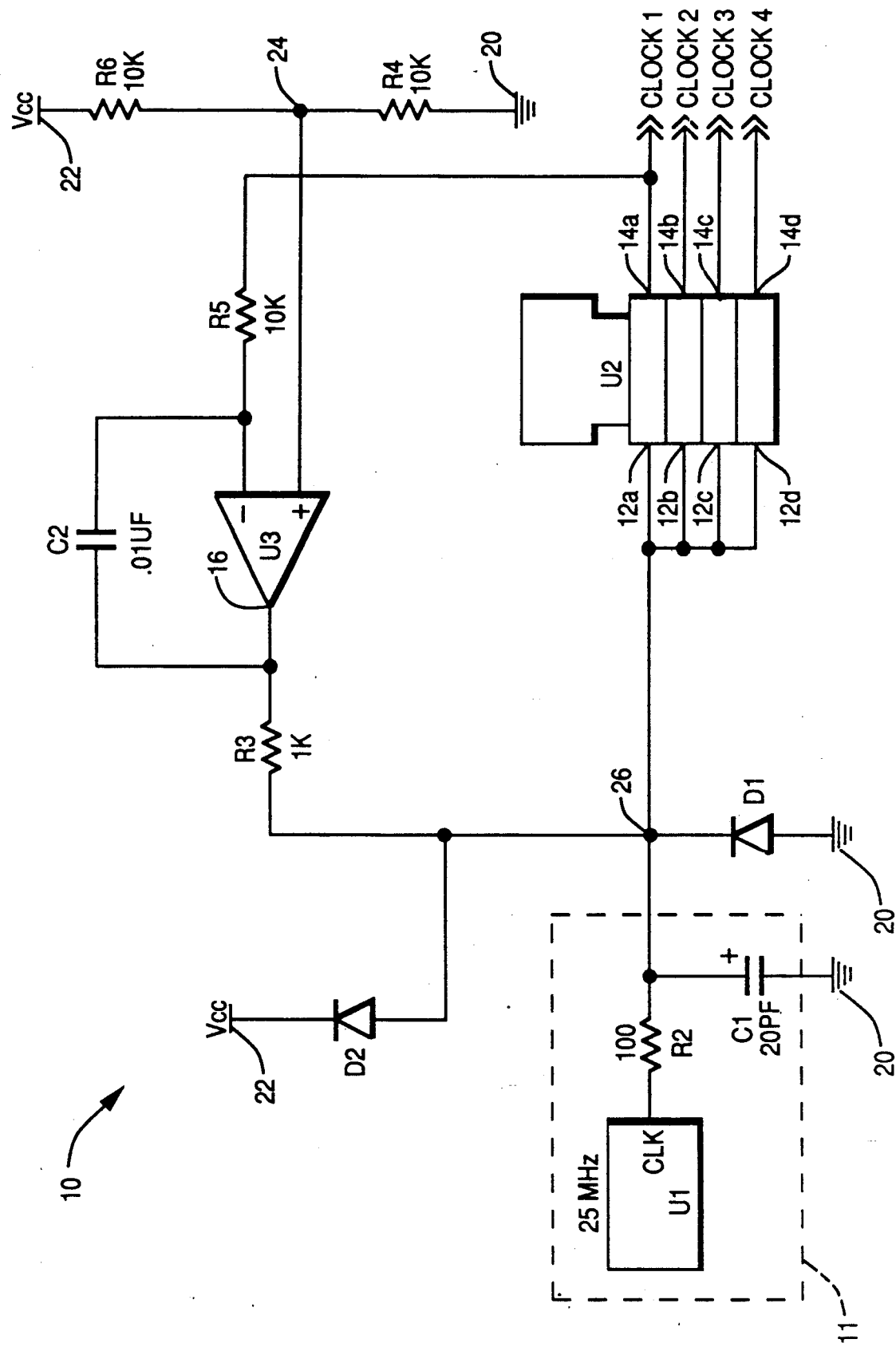

SYMMETRICAL CLOCK GENERATOR AND METHOD

The present invention relates to timing devices for electronic applications. More particularly, it relates to a device and method for generating a symmetrical clock signal.

BACKGROUND OF THE INVENTION

Central to virtually every computer system is the utilization of one or more clock signals for timing the various operations associated with the computer system. Every digital computer designed for synchronous operation has a master clock somewhere sending out one or more temporally regulated clock signals. A master clock may consist of an oscillator circuit as the source of the clock signal and a pulse generating circuit for shaping the clock signal. For most applications the clock signal is a square wave signal having regularly repeating high and low times.

Many features of the clock signal are of importance. For example, the rate at which the clock signal switches from high to low, the shape of the pulses in terms of rise and fall times for the leading and trailing edges, respectively, and the relationship or phasing between multiple signals are considered. Another feature which is of concern in some applications is the symmetry of the clock signal. What is meant by "symmetry" is the relationship between the high and low times. A perfectly symmetric clock signal would have high and low times that were the same. However, most clock signals are not perfectly symmetrical with either the high or low time exceeding the other. Certain recent microprocessor designs have imposed strict requirements on the symmetry of their input clocks. For example, one such microprocessor family requires the high and low times to be 20 nanoseconds with an allowable deviation of only +/−5%.

OBJECTS OF THE INVENTION

It is therefore an object of the present invention to provide a new and improved device for generating a symmetrical clock signal.

It is another object of the present invention to provide a new and improved method for generating a symmetrical clock signal.

It is a further object of the present invention to provide a device for generating a plurality of symmetrical clock signals.

SUMMARY OF THE INVENTION

One form of the present invention is a symmetrical clock generator comprising a signal generator, buffer and differential amplifier. The signal generator generates a periodic wave signal. The buffer receives the periodic wave signal and provides a square wave clock signal. The differential amplifier receives the clock signal and a reference voltage signal and provides an error signal to the buffer.

Another form of the present invention is a method for generating a symmetrical clock signal. A periodic wave signal is generated and converted to a square wave signal. An average voltage is then generated from the square wave signal. The average voltage is compared to a reference voltage and an error signal generated therefrom. The error signal is added to the periodic wave signal thereby completing a feedback loop for controlling the symmetry of the clock signal.

BRIEF DESCRIPTION OF THE DRAWINGS

The figure is a is circuit diagram of clock generator according to one form of the present invention.

DESCRIPTION OF A PREFERRED EMBODIMENT

The figure shows a symmetrical clock generator 10 according to one form of the present invention. Generator 10 includes a signal generator 11, a buffer U2 and a differential amplifier U3. Generator 11 generates a periodic signal on its output 26. Generator 11 comprises an oscillator U1, and a filter which includes capacitor C1 and resistor R2. In a preferred embodiment, oscillator U1 is a hermetically sealed microprocessor type oscillator, such as a CTS Knights MXO series oscillator chip. This oscillator generates a generally asymmetrical wave signal on its CLK output. What is meant by "asymmetrical" is a signal with unequal high and low times. Output 26 of generator 11 is connected to inputs 12a, 12b, 12c and 12d of buffer U2, with each input receiving the periodic signal provided by generator 11.

Buffer U2 provides four square wave clock signals CLOCK 1, CLOCK 2, CLOCK 3 AND CLOCK 4, at outputs 14a, 14b, 14c and 14d associated with inputs 12a, 12b, 12c and 12d, respectively. However, the present invention applies equally to a buffer having one or more active inputs and outputs. In a preferred embodiment, buffer U2 is a 74FCT244A octal buffer chip.

Differential amplifier U3 has − and + inputs and an output 16. The − input of differential amplifier U3 is connected to output 14a of buffer U2 through resistor R5, and receives the CLOCK 1 signal. The + input of differential amplifier U3 receives a reference voltage, as will be explained in more detail. Output 16 or differential amplifier U3 is connected to inputs 12a-12d of buffer U2 through resistor R3. Differential amplifier U3 provides an error signal to buffer U2.

Generator 10 also includes resistors R3, R4, R5 and R6, capacitor C2, and diodes D1 and D2. Resistor R2 is connected between the CLK output of oscillator U1 and the inputs 12a-12d of buffer U2. Resistor R3 is connected between output 16 of differential amplifier U3 and inputs 12a-12d of buffer U2. Resistor R5 is connected between output 14a of buffer U2 and the − input of differential amplifier U3. Resistors R4 and R6 are series connected between reference potential terminal 20 and power supply terminal 22, with the common point 24 between resistors R4 and R6 being connected to the + input of differential amplifier U3. In a preferred embodiment, reference potential terminal 20 is ground and power supply terminal 22 is +5 volts. Common point 24 supplies a fixed reference voltage (2.5 volts in a preferred embodiment) to the + input of differential amplifier U3.

Capacitor C1 is connected between inputs 12a-12d of buffer U2 and reference potential terminal 20. Capacitor C2 is connected between output 16 and the − input of differential amplifier U3. Diodes D1 and D2 are series connected between reference potential terminal 20 and power supply terminal 22. The anode of diode D1 is connected to reference potential terminal 20 and the cathode of diode D2 is connected to power supply terminal 22. The common point (output 26 of generator 11) between diodes D1 and D2 is connected to the inputs 12a-12d of buffer U2.

In operation, oscillator U1 will generate an asymmetrical square wave signal on its CLK output with a nominal swing between 0.5 and 3.5 volts. The resistor R2 and capacitor C1 filter provides a smoothing effect on the oscillator U1 CLK output creating a saw tooth wave signal, thereby enhancing the effectiveness of the differential amplifier U3 feedback loop. Buffer U2 receives the saw tooth wave signal which it converts to a square wave signal with a nominal swing between 0 and +5 volts. Basically, buffer U2 provides +5 volts when the input signal is above 1.5 volts and provides 0 volts when the input signal is below 1.5 volts.

If the output square wave output signal is perfectly symmetrical, it will have equal high and low times. In other words, if the 5 volt level is maintained for 20 nanoseconds, the 0 volt level will be maintained for 20 nanoseconds. The average voltage for such a signal is 2.5 volts. The RC circuit of resistor R5 and capacitor C2 generate this average voltage by filtering the square wave signal CLOCK 1. The average voltage is then provided to the − input of differential amplifier U3, and a reference voltage is provided to the + input of differential amplifier U3. The reference voltage is supplied by power supply terminal 22 and voltage divider R6-R4. In a preferred embodiment, terminals 22 and 20 are at five and zero volts, respectively, and the resistance of R4 and R6 are the same. Thus, the reference voltage at the + input is 2.5 volts. Differential amplifier U3 compares the average voltage and reference voltage at the − and + inputs, respectively, and provides an error signal at its output 16. This error signal is connected to common point 26 where it is added to the saw tooth wave signal.

If the square wave output CLOCK 1 is not symmetrical, the error signal will change to correct the error. For example, if the high time is greater than the low time, the average voltage will be greater than 2.5 volts. Since the average voltage is applied to the − input of differential amplifier U3, the error signal will be at a negative voltage level. This will effectively shift the saw tooth wave down which will decrease the high time of the square wave output signal and increase the low time.

During start-up the output of differential amplifier U3 may exceed the maximum output voltage rating of oscillator U1 and/or the maximum input voltage rating of buffer U2. Diodes D1 and D2 provide protection for oscillator U1 and buffer U2 by preventing the maximum voltage ratings from being exceeded.

It will be clear to those skilled in the art that the present invention is not limited to the specific embodiment disclosed and illustrated herein. Nor is the invention limited to the signal generator 11 shown and described for generating a saw tooth wave signal. Rather, it applies equally to a signal generator which generates any periodic signal that can be utilized for the production of a square wave clock signal. For example, the present invention may be utilized with a signal generator which generates a sinusoidal wave signal.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A symmetrical clock generator comprising:
    a generator for generating a periodic wave signal;
    a buffer for receiving said periodic wave signal and for providing a square wave clock signal; and
    a differential amplifier for receiving said clock signal and a reference voltage signal and providing an error signal to said buffer.

2. A symmetrical clock generator comprising:
    a generator for generating a periodic wave signal;
    a buffer having an input for receiving said periodic wave signal and having an output for providing a square wave clock signal; and
    a differential amplifier for receiving said clock signal at a first input and a reference voltage signal at a second input and providing an error signal at its output to said buffer input.

3. The clock generator of claim 2 wherein said periodic wave signal generator comprises:
    an oscillator for generating an asymmetrical square wave signal at an output thereof; and
    a filter for receiving said asymmetrical square wave signal and generating said periodic wave signal.

4. The clock generator of claim 3 wherein said filter comprises:
    a second resistor connected between the output of said oscillator and the input of said buffer.

5. The clock generator of claim 4 wherein said filter further comprises:
    a second capacitor connected between the input of said buffer and a reference potential terminal.

6. The clock generator of claim 5 wherein said reference potential terminal is ground.

7. The clock generator of claim 2 further comprising:
    a first resistor connected between the output of said buffer and the first input of said differential amplifier.

8. The clock generator of claim 2 further comprising:
    a first capacitor connected between the output and first input of said differential amplifier.

9. The clock generator of claim 2 further comprising:
    first and second diodes series connected between a reference potential terminal and a power supply terminal;
    wherein the anode of said first diode is connected to said reference potential terminal, the cathode of said second diode is connected to said power supply terminal, and the common point between said diodes is connected to the input of said buffer.

10. The clock generator of claim 9 wherein said reference potential terminal is ground.

11. The clock generator of claim 2 further comprising:
    a third resistor connected between the output of said differential amplifier and the input of said buffer.

12. The clock generator of claim 2 further comprising:
    a reference potential terminal and a power supply terminal; and
    fourth and fifth resistors series connected between said reference potential terminal and power supply terminal;
    wherein the common point between said fourth and fifth resistors is connected to said second input terminal of said differential amplifier.

13. The clock generator of claim 12 wherein said reference potential terminal is ground.

14. The clock generator of claim 2 wherein said periodic wave signal is a saw tooth wave signal.

15. A symmetrical clock generator comprising:

a generator for generating a periodic wave signal at an output thereof;

a buffer having an input for receiving said periodic wave signal and having an output for providing a square wave output clock signal;

a differential amplifier for receiving said clock signal at a first input and a reference voltage signal at a second input and providing an error signal at its output to said buffer input.

a first resistor connected between the output of said buffer and the first input of said differential amplifier; and a first capacitor connected between the output and first input of said differential amplifier.

16. The clock generator of claim 15 wherein said periodic wave signal generator comprises:

an oscillator for generating an asymmetrical square wave signal at an output thereof; and a filter for receiving said asymmetrical square wave signal and generating said periodic wave signal.

17. The clock generator of claim 16 further comprising:

first and second diodes series connected between a reference potential terminal and a power supply terminal;

wherein the anode of said first diode is connected to said reference potential terminal, the cathode of said second diode is connected to said power supply terminal, and the common point between said diodes is connected to the input of said buffer.

18. The clock generator of claim 17 wherein said filter comprises:

a second resistor connected between the output of said oscillator and the input of said buffer; and a second capacitor connected between the input of said buffer and said reference potential terminal.

19. The clock generator of claim 18 further comprising:

a third resistor connected between the output of said differential amplifier and the input of said buffer.

20. The clock generator of claim 19 further comprising:

fourth and fifth resistors series connected between said reference potential terminal and power supply terminal;

wherein the common point between said fourth and fifth resistors is connected to said second input terminal of said differential amplifier.

21. The clock generator of claim 20 wherein said reference potential terminal is ground.

22. A method for generating a symmetrical clock signal comprising:

generating a periodic wave signal;

converting said periodic wave signal to a square wave clock signal;

generating an average voltage from said clock signal;

comparing said average voltage to a reference voltage and generating an error signal therefrom; and adding said error signal to said periodic wave signal.

23. The method of claim 22 wherein said periodic wave signal is a saw tooth wave signal.

24. The method of claim 23 wherein said comparing step includes:

providing said average voltage and said reference voltage to a differential amplifier;

wherein said error signal is provided by the output of said differential amplifier.

25. The method of claim 24 wherein said step of generating an average voltage includes:

filtering said square wave signal.

26. The method of claim 25 wherein said filtering is provided by an RC circuit.

* * * * *